(12) United States Patent
Zhang

(10) Patent No.: US 11,296,128 B2
(45) Date of Patent: Apr. 5, 2022

(54) ARRAY SUBSTRATE AND DISPLAY DEVICE HAVING THE ARRAY SUBSTRATE

(71) Applicant: WUHAN CHINA STAR OPTOELECTRONICS SEMICONDUCTOR DISPLAY TECHNOLOGY CO., LTD., Hubei (CN)

(72) Inventor: Fuyang Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 317 days.

(21) Appl. No.: 16/489,500

(22) PCT Filed: Apr. 16, 2019

(86) PCT No.: PCT/CN2019/082847
§ 371 (c)(1),
(2) Date: Aug. 28, 2019

(87) PCT Pub. No.: WO2020/172965
PCT Pub. Date: Sep. 3, 2020

(65) Prior Publication Data
US 2021/0335844 A1    Oct. 28, 2021

(30) Foreign Application Priority Data
Feb. 27, 2019  (CN) .......................... 201910146594.X

(51) Int. Cl.
*H01L 27/12*   (2006.01)
*H01L 27/32*   (2006.01)

(52) U.S. Cl.
CPC ...... *H01L 27/1248* (2013.01); *H01L 27/1244* (2013.01); *H01L 27/3258* (2013.01); *H01L 2251/5338* (2013.01)

(58) Field of Classification Search
CPC ........... H01L 51/0097; H01L 51/50–56; H01L 2251/5338; H01L 27/32–3297
See application file for complete search history.

(56) References Cited

U.S. PATENT DOCUMENTS

2011/0227087 A1* 9/2011 Moriwaki ........... H01L 27/3265
257/71
2015/0380679 A1* 12/2015 Fujiyoshi ............ H01L 51/5253
257/99

(Continued)

FOREIGN PATENT DOCUMENTS

CN   103117285 A   5/2013
CN   107342373 A   11/2017

(Continued)

OTHER PUBLICATIONS

English translation of KR20160019080 (Year: 2016).*

(Continued)

*Primary Examiner* — Bryan R Junge

(57) ABSTRACT

An array substrate and a display device having the array substrate are disclosed. The array substrate includes a display area, a non-display area, a metal trace, a planarization structure layer, and a reinforcing layer. The non-display area includes a bendable region connected to the display area. The metal trace extends from the display area to the bendable region. The planarization structure layer covers the metal trace in the display area and the bendable region. The reinforcing layer is disposed on the planarization structure layer in the bendable region. In the array substrate and the display device with the array substrate of the invention, a water and oxygen barrier layer is only disposed in the (Continued)

display area, and functional layers are provided, therefore stresses during bending process can be reduced, and metal trace crack can be avoided.

9 Claims, 2 Drawing Sheets

(56) References Cited

U.S. PATENT DOCUMENTS

| | | | |
|---|---|---|---|
| 2016/0204183 A1* | 7/2016 | Tao | H01L 27/3276 257/40 |
| 2016/0268320 A1* | 9/2016 | Long | H01L 29/4908 |
| 2017/0148863 A1 | 5/2017 | Yoon et al. | |
| 2018/0012885 A1 | 1/2018 | Zhang et al. | |
| 2018/0342707 A1* | 11/2018 | Lee | H01L 27/3258 |
| 2018/0366586 A1* | 12/2018 | Son | H01L 27/1262 |
| 2018/0375056 A1* | 12/2018 | Sonoda | H01L 27/3244 |
| 2019/0326554 A1 | 10/2019 | Zeng | |
| 2020/0051810 A1 | 2/2020 | Um et al. | |
| 2021/0104585 A1* | 4/2021 | Gao | H01L 51/5228 |

FOREIGN PATENT DOCUMENTS

| | | | | |
|---|---|---|---|---|
| CN | 107946342 A | | 4/2018 | |
| CN | 107994055 A | * | 5/2018 | H01L 27/3276 |
| CN | 108666439 A | | 10/2018 | |
| CN | 109065505 A | * | 12/2018 | H01L 27/3246 |
| KR | 20160019080 A | * | 2/2016 | |
| KR | 20180042515 A | * | 4/2018 | B32B 3/08 |

OTHER PUBLICATIONS

English translation of CN 107994055 (Year: 2018).*
English translation of CN 109065505 (Year: 2018).*
Machine translation of KR-20180042515-A (Year: 2018).*

* cited by examiner

ARRAY SUBSTRATE AND DISPLAY DEVICE HAVING THE ARRAY SUBSTRATE

FIELD OF INVENTION

This invention relates to the field of display, and, in particular, to an array substrate and a display device having the array substrate.

BACKGROUND OF INVENTION

With development of active-matrix organic light-emitting diode (AMOLED) display technology, and the increasingly demanding requirements of people for display panel, display panel border designs such as slim border designs are increasingly needed, especially slim bottom border designs.

In theory, if a flexible substrate is used in an AMOLED panel, a structural design of an ultra-slim bottom border can be achieved. However, a portion of the display panel in the bottom border needs to be bent, so that a portion of the display panel in a display area is flat, and a portion of the display panel in a non-display area is bent to the back of the display panel. There are many difficulties in the production process in practice, especially during the bending process, the metal traces in the bending area are deformed due to stress caused by bending, which makes the metal traces crack easily. Therefore, how to ensure the reliability of the metal traces in the bending area, that is, the metal traces will not be damaged by bending, is a problem which needs to be solved urgently.

SUMMARY OF INVENTION

To solve above problem, the present invention provides an array substrate and a display device having the array substrate. The array substrate has a reinforcing layer disposed on the planarization structure layer in the bendable region, so that stresses in the bendable region during bending process can be reduced, and the metal trace crack can be avoided.

The solution to above problem is that the present invention provides an array substrate, including a display area, a non-display area, a metal trace, a planarization structure layer, and a reinforcing layer. The non-display area includes a bendable region connected to the display area. The metal trace extends from the display area to the bendable region. The planarization structure layer covers the metal trace in the display area and the bendable region. The reinforcing layer is disposed on the planarization structure layer in the bendable region.

In an embodiment of the present invention, in the display area and the bendable region, the array substrate further includes a first base layer; a water and oxygen barrier layer disposed on the first base layer; a second base layer disposed on the water and oxygen barrier layer; a buffer structure layer disposed on the second base layer; a first gate insulating layer disposed on the buffer structure layer; a second gate insulating layer disposed on the first gate insulating layer; and a dielectric layer disposed on the second gate insulating layer, wherein the metal trace is disposed on the dielectric layer.

In another embodiment of the present invention, the buffer structure layer includes a first buffer layer disposed on the second base layer; a second buffer layer disposed on the first buffer layer; and a third buffer layer disposed on the second buffer layer; wherein material of the first buffer layer is silicon dioxide, material of the second buffer layer is silicon oxynitride, and material of the third buffer layer is silicon dioxide; and wherein the first buffer layer has a thickness of 450 nm to 550 nm; the second buffer layer has a thickness of 35 nm to 45 nm; and the third buffer layer has a thickness of 180 nm to 220 nm.

In another embodiment of the present invention, the planarization structure layer includes a first planarization layer disposed on the dielectric layer and the metal trace; and a second planarization layer disposed on the first planarization layer; wherein the reinforcing layer is disposed between the first planarization layer and the second planarization layer; and wherein materials of the first planarization layer and the second planarization layer are both polyimide, the first planarization layer has a thickness of 1 µm to 2 µm; and the second planarization layer has a thickness of 2 µm to 4 µm.

In another embodiment of the present invention, the array substrate further includes an active layer disposed on the buffer structure layer in the display area, wherein the active layer has a source region and a drain region; a first gate layer disposed on the first gate insulating layer; a second gate layer disposed on the second gate insulating layer; a source and a drain, wherein the source extends from the metal trace to a source region of the active layer, and the drain extends from the metal trace to a drain region of the active layer; and an anode trace disposed on the planarization structure layer and connected to the drain.

In another embodiment of the present invention, the anode trace includes a first protective layer; a first metal layer disposed on the first protective layer; and a second protective layer disposed on the first metal layer; wherein the first protective layer has a thickness of 10 nm to 20 nm, the first metal layer has a thickness of 90 nm to 110 nm, and the second protective layer has a thickness of 10 nm to 20 nm.

In another embodiment of the present invention, materials of the first base layer and the second base layer are both polyimide, the first base layer has a thickness of 5-15 um, and the second base layer has a thickness of 5-15 um.

In another embodiment of the present invention, material of the reinforcing layer has a modulus of elasticity of 100 GPa to 300 GPa, and the material includes at least one of graphene, carbon nanotubes, and silicon oxide nanowires.

In another embodiment of the present invention, the metal trace includes a second metal layer; a third metal layer disposed on the second metal layer; and a fourth metal layer disposed on the third metal layer; wherein the second metal layer has a thickness of 70 nm to 90 nm, the third metal layer has a thickness of 550 nm to 650 nm, and the fourth metal layer has a thickness of 70 nm to 90 nm.

The present invention further provides a display device having the array substrate.

In the array substrate and the display device having the array substrate of the present invention, the reinforcing layer is added in the planarization structure layer in the bendable region, and the material of the reinforcing layer has a high modulus of elasticity, so during bending process, a neutral surface can be brought close to the metal trace as much as possible, or the neutral surface completely falls into the layer where the metal trace is located, so that the metal trace crack due to bending can be reduced effectively. At the same time, the structure of the metal trace is a laminated structure of titanium-aluminum-titanium, which can reinforce strength of the metal trace, and the metal trace deformation during bending process can be avoided.

DESCRIPTION OF DRAWINGS

In order to more clearly illustrate the technical solutions in the embodiments of the present invention, the drawings used in the description of the embodiments will be briefly described below. Obviously, the drawings in the following description are only some embodiments of the present invention, and those skilled in the art can obtain other drawings according to these drawings without any creative work.

Figure 1:
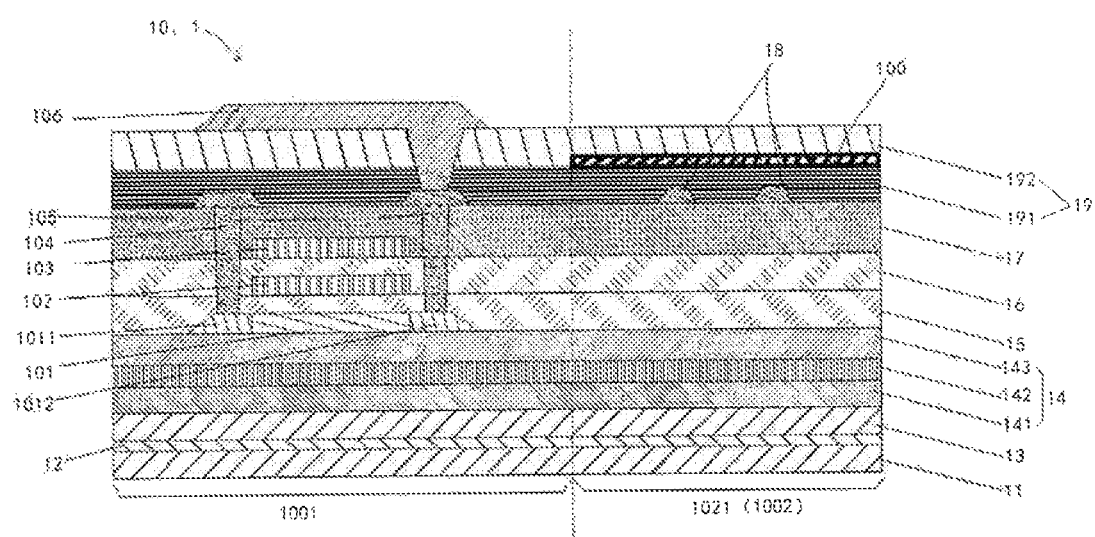
FIG. 1 is a structural diagram of an array substrate in an embodiment of the present invention.

REFERENCE NUMBERS AND RELATED PARTS IN THE DRAWINGS 1 display device
10 array substrate
1001 display area
1002 non-display area
1021 bendable region
11 first base layer
12 water and oxygen barrier layer
13 second base layer
14 buffer structure layer
15 first gate insulating layer
16 second gate insulating layer
17 dielectric layer
18 metal trace
19 planarization structure layer
100 reinforcing layer
101 active layer
102 first gate layer
103 second gate layer
104 source
105 drain
106 anode trace
141 first buffer layer
142 second buffer layer
143 third buffer layer
181 second metal layer
182 third metal layer
183 fourth metal layer
191 first planarization layer
192 second planarization layer
1061 first protective layer
1062 first metal layer
1063 second protective layer
1011 source region
1012 drain region

DETAILED DESCRIPTION OF PREFERRED EMBODIMENTS

The embodiments of the present invention are described in detail below, and the examples of the embodiments are illustrated in the accompanying drawings, wherein the same or similar reference numerals are used to refer to the same or similar elements or elements having the same or similar functions. The embodiments described below are exemplified and are merely illustrative of the invention, and they are not to be construed as limiting the invention.

The following description of the various embodiments is provided to illustrate the specific embodiments. Directional terms mentioned in this invention, such as [upper], [lower], [front], [back], [left], [right], [inside], [outside], [side], etc., are only the direction of the drawing for reference. Therefore, the directional terminology used is for the purpose of illustration and understanding, and is not intended to be limited.

As shown in FIG. 1, in an embodiment, an array substrate 10 of the present invention includes a display area 1001 and a non-display area 1002. The non-display area 1002 has a bendable region 1021 connected to the display area 1001.

In the display area 1001 and the bendable region 1021, the array substrate 10 includes a first base layer 11, a water and oxygen barrier layer 12, a second base layer 13, a buffer structure layer 14, a first gate insulating layer 15, a second gate insulating layer 16, a dielectric layer 17, a metal trace 18, and a planarization structure layer 19. In the bendable region 1021, the structure of the array substrate 10 further includes a reinforcing layer 100.

The structure of the array substrate 10 will hereinafter be described in conjunction with FIG. 1.

The first base layer 11 extends from the display area 1001 to the bendable region 1021. In a practical fabricating process, the first base layer 11 is formed of polyimide first, and the first base layer 11 has a thickness of 5 um to 15 um, 10 um is preferred.

The water and oxygen barrier layer 12 is disposed on the first base layer 11. In a practical fabricating process, at least one of silicon oxide, silicon nitride, and amorphous silicon is deposited on the first base layer 11 in the display area 1001 to form the water and oxygen barrier layer 12, and the water and oxygen barrier layer 12 has a thickness of 500 nm.

The second base layer 13 is disposed on the water and oxygen barrier layer 12. The material of the second base layer 13 is polyimide, too, and it is the same with the material of the first base layer 11. The second base layer 13 has a thickness of 5 um to 15 um, 10 um is preferred.

The buffer structure layer 14 is disposed on the second base layer 13. The buffer structure layer 14 includes a first buffer layer 141, a second buffer layer 142, and a third buffer layer 143. In a practical fabricating process, silicon oxide is deposited on the second base layer 13 to form the first buffer layer 141, and the first buffer layer 141 has a thickness of 450 nm to 550 nm, 500 nm is preferred. Then, silicon nitride is deposited on the first buffer layer 141 to form the second buffer layer 142, and the second buffer layer 142 has a thickness of 35 nm to 45 nm, 40 nm is preferred. After that, silicon oxide is deposited on the second buffer layer 142 to form the third buffer layer 143, and the third buffer layer has a thickness of 180 nm to 220 nm, 200 nm is preferred.

In the display area 1001, the array substrate 10 further includes an active layer 101, a first gate layer 102, a second gate layer 103, a source 104, a drain 105, and an anode trace 106.

The active layer 101 is disposed on the buffer structure layer 14 in the display area 1001. P-type (P+) ion doping is performed in the active layer 101. The active layer 101 has a source region 1011 and a drain region 1012, and the active layer 101 has a thickness of 45 nm to 55 nm, 50 nm is preferred.

The first gate insulating layer 15 is formed on the active layer 101 and the third buffer layer 143. In a practical fabricating process, silicon oxide is deposited on the active layer 101 and the third buffer layer 143 to form the first gate insulating layer 15, and the first gate insulating layer 15 has a thickness of 135 nm to 145 nm, 140 nm is preferred.

The first gate layer 102 is disposed on the first gate insulating layer 15 in the display area 1001. In a practical fabricating process, molybdenum is deposited on the first gate insulating layer 15 to form the first gate layer 102, and the first gate layer 102 has a thickness of 240 nm to 260 nm, 250 nm is preferred.

The second gate insulating layer 16 is disposed on the first gate insulating layer 15, and the second gate insulating layer 16 also covers the first gate layer 102 in the display area 1001. In a practical fabricating process, silicon nitride is deposited on the first gate layer 102 and the first gate insulating layer 15 to form the second gate insulating layer 16. The second gate insulating layer 16 has a thickness of 135 nm to 145 nm, 140 nm is preferred.

The second gate layer 103 is disposed on the second gate insulating layer 16 in the display area 1001. In a practical fabricating process, molybdenum is deposited on the second gate insulating layer 16 to form the second gate layer 103, and the second gate layer 103 has a thickness of 240 nm to 260 nm, 250 nm is preferred.

The dielectric layer 17 is disposed on the second gate insulating layer 16, and the dielectric layer 17 also covers the second gate layer 103 in the display area 1001. In a practical fabricating process, silicon oxide is deposited on the second gate insulating layer 16 and the second gate layer 103 to form the dielectric layer 17. The dielectric layer 17 has a thickness of 450 nm to 550 nm, 500 nm is preferred. Then vias are formed in the display area 1001. These vias penetrate the dielectric layer 17, the second gate insulating layer 16, and the first gate insulating layer 15 and expose the active layer 101. One of the vias is disposed correspondingly to the source region 1011, and another one of the vias is disposed correspondingly to the drain region 1012.

Figure 2:
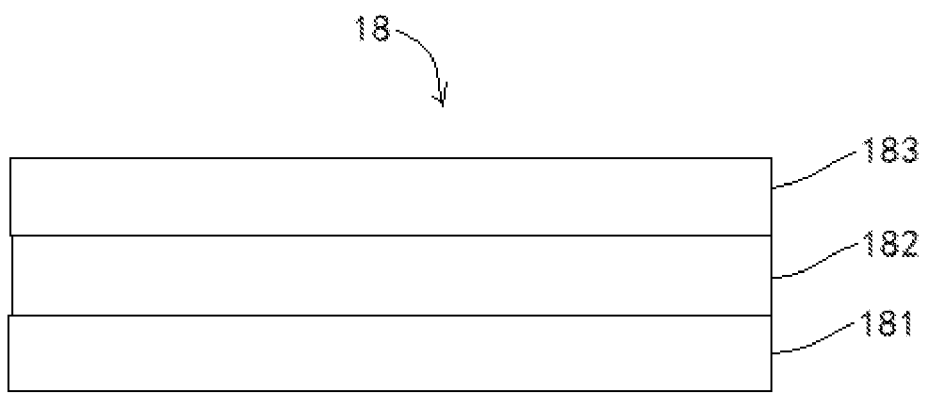
FIG. 2 is a structural diagram of a metal trace in an embodiment of the present invention.

The metal trace 18 is disposed on the dielectric layer 17, and the metal trace 18 extends from the display area 1001 to the bendable region 1021. As shown in FIG. 2, the metal trace 18 includes a second metal layer 181, a third metal layer 182 and a fourth metal layer 183. In a practical fabricating process, titanium is deposited in the vias and on the dielectric layer 17 to form the second metal layer 181. The second metal layer 181 has a thickness of 70 nm to 90 nm, 80 nm is preferred. Then aluminum is deposited on the second metal layer 181 to form the third metal layer 182. The third metal layer 182 has a thickness of 550 nm to 650 nm, 600 nm is preferred. After that, titanium is deposited on the third metal layer 182 to form the fourth metal layer 183. The fourth metal layer 183 has a thickness of 40 nm to 60 nm, 50 nm is preferred. The final structure of the metal trace 18 is a laminated structure of titanium-aluminum-titanium. The metal trace 18 in the vias corresponding to the source region 1011 is used as the source 104, and the metal trace 18 in the vias corresponding to the drain region 1012 is used as the drain 105. The laminated structure of titanium-aluminum-titanium can reinforce strength of the metal trace 18, so that stresses in the metal trace 18 during bending process can be reduced, and the metal trace crack can be avoided.

The planarization structure layer 19 is disposed on the dielectric layer 17 and the metal trace 18. The planarization structure layer 19 includes a first planarization layer 191 and a second planarization layer 192. The first planarization layer 191 is disposed on the dielectric layer 17 and the metal trace 18, and the second planarization layer 192 is disposed on the first planarization layer 191. Materials of the first planarization layer 191 and the second planarization layer 192 are both polyimide. Specifically, after the metal trace 18 is formed, polyimide is deposited on the dielectric layer 17 and the metal trace 18 to form the first planarization layer 191. The first planarization layer 191 has a thickness of 1 um to 2 um, 1.5 um is preferred. Then polyimide is deposited again to form the second planarization layer 192, which has a thickness of 2 um to 4 um, 3 um is preferred. The two planarization layers 191,192 formed by two depositions can further improve the flatness of the planarization structure layer 19. After that, a hole is formed in the planarization structure layer 19. The hole penetrates the planarization structure layer 19, and the drain 105 is exposed from the hole.

In the bendable region 1021, the reinforcing layer 100 is disposed between the first planarization layer 191 and the second planarization layer 192. Material of the reinforcing layer 100 has a modulus of elasticity of 100 GPa to 300 GPa, and the material includes at least one of graphene, carbon nanotubes, and silicon oxide nanowires. The reinforcing layer 100 has a thickness of 450 nm to 550 nm, 500 nm is preferred. In this embodiment, the reinforcing layer 100 is added in the planarization structure layer 19 in the bendable region 1021, and the material of the reinforcing layer 100 has a high modulus of elasticity, so during bending process, a neutral surface can be brought close to the metal trace 18 as much as possible, or the neutral surface completely falls into the layer where the metal trace 18 is located, so that the metal trace crack due to bending can be reduced effectively.

Figure 3:
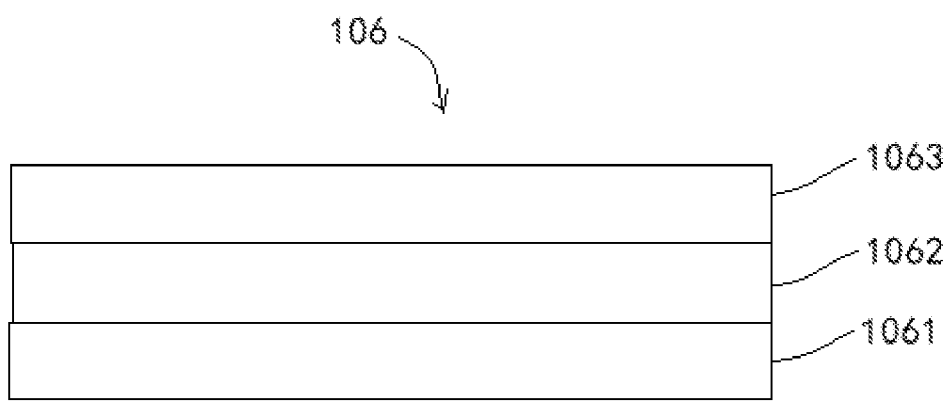
FIG. 3 is a structural diagram of an anode trace in an embodiment of the present invention.

The anode trace 106 is disposed on the planarization structure layer 19 and connected to the drain 105. As shown in FIG. 3, the anode trace 106 includes a first protective layer 1061, a first metal layer 1062, and a second protective layer 1063. In a practical fabricating process, indium tin oxide is deposited on the second planarization layer 192 and in the hole to form the first protective layer 1061. The first protective layer 1061 has a thickness of 10 nm to 20 nm, 15 nm is preferred. Then silver is deposited to form the first metal layer 1062, which has a thickness of 90 nm to 110 nm, 100 nm is preferred. After that, indium tin oxide is deposited again to form the second protective layer 1063, which has a thickness of 10 nm to 20 nm, 15 nm is preferred. The final structure of the anode trace 106 is a laminated structure of indium tin oxide-sliver-indium tin oxide.

The invention further discloses a display device, including the array substrate in the embodiment. Of course, the point of the present invention is the array substrate 10. As for other structures or devices of the display device 1, such as color filter substrates or thin-film encapsulation layers, the details are not described in detail.

The above are only the preferred embodiments of the present invention, and are not intended to limit the present invention. Any modifications, equivalents, and improvements made within the spirit and scope of the present invention should be included in the scope of the present invention.

What is claimed is:

1. An array substrate, comprising:
   a display area and a non-display area, the non-display area comprising a bendable region connected to the display area;
   metal traces extending from the display area to the bendable region;
   a planarization structure layer covering the metal traces in the display area and the bendable region; and
   a reinforcing layer disposed on the planarization structure layer in the bendable region, wherein material of the reinforcing layer has a modulus of elasticity of 100 GPa to 300 GPa, and the material comprises at least one of graphene, carbon nanotubes, and silicon oxide nanowires.

2. The array substrate as claimed in claim 1, wherein in the display area and the bendable region, the array substrate further comprises:
   a first base layer;

a water and oxygen barrier layer disposed on the first base layer;

a second base layer disposed on the water and oxygen barrier layer;

a buffer structure layer disposed on the second base layer;

a first gate insulating layer disposed on the buffer structure layer;

a second gate insulating layer disposed on the first gate insulating layer; and a dielectric layer disposed on the second gate insulating layer;

wherein the metal traces are disposed on the dielectric layer.

3. The array substrate as claimed in claim 2, wherein the buffer structure layer comprises:

a first buffer layer disposed on the second base layer;
a second buffer layer disposed on the first buffer layer; and
a third buffer layer disposed on the second buffer layer;
wherein material of the first buffer layer is silicon dioxide, material of the second buffer layer is silicon oxynitride, and material of the third buffer layer is silicon dioxide; and wherein the first buffer layer has a thickness of 450 nm to 550 nm, the second buffer layer has a thickness of 35 nm to 45 nm, and the third buffer layer has a thickness of 180 nm to 220 nm.

4. The array substrate as claimed in claim 2, wherein the planarization structure layer comprises:

a first planarization layer disposed on the dielectric layer and the metal traces; and a second planarization layer disposed on the first planarization layer;

wherein the reinforcing layer is disposed between the first planarization layer and the second planarization layer; and wherein materials of the first planarization layer and the second planarization layer are both polyimide, the first planarization layer has a thickness of 1 μm to 2 μm, and the second planarization layer has a thickness of 2 μm to 4 μm.

5. The array substrate as claimed in claim 2, wherein the array substrate further comprises:

an active layer disposed on the buffer structure layer, wherein the active layer has a source region and a drain region;

a first gate layer disposed on the first gate insulating layer;

a second gate layer disposed on the second gate insulating layer;

a source and a drain, wherein the source extends from one of the metal traces to a source region of the active layer, and the drain extends from another one of the metal traces to a drain region of the active layer; and an anode trace disposed on the planarization structure layer and connected to the drain.

6. The array substrate as claimed in claim 5, wherein the anode trace comprises:

a first protective layer;
a first metal layer disposed on the first protective layer; and
a second protective layer disposed on the first metal layer;
wherein the first protective layer has a thickness of 10 nm to 20 nm, the first metal layer has a thickness of 90 nm to 110 nm, and the second protective layer has a thickness of 10 nm to 20 nm.

7. The array substrate as claimed in claim 3, wherein materials of the first base layer and the second base layer are both polyimide, the first base layer has a thickness of 5 um to 15 um, and the second base layer has a thickness of 5 um to 15 um.

8. The array substrate as claimed in claim 1, wherein one of the metal traces comprises:

a second metal layer;
a third metal layer disposed on the second metal layer; and
a fourth metal layer disposed on the third metal layer;
wherein the second metal layer has a thickness of 70 nm to 90 nm, the third metal layer has a thickness of 550 nm to 650 nm, and the fourth metal layer has a thickness of 70 nm to 90 nm.

9. A display device, comprising the array substrate as claimed in claim 1.

* * * * *